(12) United States Patent
Murakami et al.

(10) Patent No.: US 9,972,486 B2
(45) Date of Patent: May 15, 2018

(54) NITRIDE FILM FORMING METHOD AND STORAGE MEDIUM

(71) Applicant: TOKYO ELECTRON LIMITED, Tokyo (JP)

(72) Inventors: Hiroki Murakami, Nirasaki (JP); Takahiro Miyahara, Nirasaki (JP); Daisuke Suzuki, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days. days.

(21) Appl. No.: 15/465,789

(22) Filed: Mar. 22, 2017

(65) Prior Publication Data

US 2017/0278697 A1   Sep. 28, 2017

(30) Foreign Application Priority Data

Mar. 23, 2016   (JP) ................................ 2016-057910

(51) Int. Cl.
| | |
|---|---|
| *H01L 21/02* | (2006.01) |
| *C23C 16/34* | (2006.01) |
| *C23C 16/455* | (2006.01) |
| *C23C 16/52* | (2006.01) |

(52) U.S. Cl.
CPC ........ *H01L 21/0217* (2013.01); *C23C 16/345* (2013.01); *C23C 16/45525* (2013.01); *C23C 16/45527* (2013.01); *C23C 16/45534* (2013.01); *C23C 16/52* (2013.01); *H01L 21/0228* (2013.01); *H01L 21/02211* (2013.01)

(58) Field of Classification Search
CPC ............. H01L 21/0217; H01L 21/0228; H01L 21/02211; C23C 16/345; C23C 16/45534; C23C 16/45525; C23C 16/45527
See application file for complete search history.

(56) References Cited

U.S. PATENT DOCUMENTS

| | | | |
|---|---|---|---|
| 9,034,774 B2* | 5/2015 | Tanaka .................. | C23C 16/345 438/758 |
| 2015/0206737 A1* | 7/2015 | Takasawa ......... | C23C 16/45531 438/785 |
| 2015/0348778 A1* | 12/2015 | Shimizu ............ | H01L 21/02167 438/786 |
| 2016/0013042 A1* | 1/2016 | Hashimoto ............. | C23C 16/30 438/778 |

FOREIGN PATENT DOCUMENTS

JP        2004-281853 A        10/2004

* cited by examiner

*Primary Examiner* — Michael Trinh
(74) *Attorney, Agent, or Firm* — Nath, Goldberg & Meyer; Jerald L. Meyer (57) ABSTRACT

There is provided a method for forming a nitride film on a substrate to be processed by a thermal ALD which repeats: supplying a film forming raw material gas to the substrate to be processed while heating the substrate to be processed to a predetermined temperature; and supplying a nitriding gas to the substrate to be processed, the nitride film forming method comprises supplying a chlorine-containing gas to the substrate to be processed after the supplying the film forming raw material gas.

11 Claims, 8 Drawing Sheets

NITRIDE FILM FORMING METHOD AND STORAGE MEDIUM

CROSS-REFERENCE TO RELATED APPLICATION

This application claims the benefit of Japanese Patent Application No. 2016-057910, filed on Mar. 23, 2016, in the Japan Patent Office, the disclosure of which is incorporated herein in its entirety by reference.

TECHNICAL FIELD

The present disclosure relates to a method of forming a nitride film such as a silicon nitride film or the like and a non-transitory computer-readable storage medium.

BACKGROUND

In a semiconductor device manufacturing sequence, there is a film forming process for forming a nitride film such as a silicon nitride film (SiN film) or the like as an insulating film on a semiconductor wafer represented by a silicon wafer. A chemical vapor deposition (CVD) method is widely used for such a SiN film forming process.

On the other hand, in recent years, along with the progress of miniaturization and high integration of semiconductor devices, from the viewpoint of improvement in characteristics, a SiN film is formed by sequentially supplying gases as in an atomic layer deposition (ALD) method capable of forming a film of good quality at a lower temperature than the film formation by the conventional CVD method. In the case of forming the SiN film by the ALD method, for example, a SiN film having a predetermined film thickness is formed by causing a Si raw material to be adsorbed onto a substrate to be processed, subsequently supplying a nitriding gas so as to react with the Si raw material, forming SiN at an atomic layer or molecular layer level, and repeating the above steps a predetermined number of times.

As a method of forming a SiN film by an ALD method, there has been proposed a technique in which a dichlorosilane (DCS; $SiH_2Cl_2$) gas, which is a Si raw material gas, and an ammonia ($NH_3$) gas, which is a nitriding gas, are alternately supplied, and at the time of supplying the $NH_3$, high frequency power is applied so as to generate plasma to promote a nitriding reaction.

Since an apparatus configuration becomes complicated in the case of using plasma, it has been studied to form, as in a thermal ALD method or the like, a SiN film by a plasma-less sequential gas supply.

However, when a SiN film is formed by a thermal ALD method, an incubation time during which film growth does not proceed despite alternately supplying a Si raw material gas and a nitriding gas is generated at an initial stage of film formation. When the incubation time is present, the film formation varies two-dimensionally at the initial stage of film formation. Thus, the film has an island-like distribution, the surface roughness at the time of film formation becomes larger, and weak film portions occur locally. In the case where a DCS gas is used as a Si raw material, the incubation time varies depending on a base film. When an extremely thin film is formed on different base films, there may be generated a state in which a film is formed on one base film but is not formed on the other base film.

SUMMARY

Some embodiments of the present disclosure provide a nitride film forming method capable of shortening an incubation time when a nitride film such as a silicon nitride film or the like is formed by a plasma-less sequential gas supply. Furthermore, some embodiments of the present disclosure provide a nitride film forming method capable of making an incubation time hard to change depending on a base film.

According to one embodiment of the present disclosure, there is provided a method for forming a nitride film on a substrate to be processed by a thermal ALD which repeats: supplying a film forming raw material gas to the substrate to be processed while heating the substrate to be processed to a predetermined temperature; and supplying a nitriding gas to the substrate to be processed, the nitride film forming method comprises supplying a chlorine-containing gas to the substrate to be processed after the supplying the film forming raw material gas.

According to another embodiment of the present disclosure, there is provided a non-transitory computer-readable storage medium storing a program operated on a computer and configured to control a processing apparatus, wherein the program is configured to, when executed, cause the computer to control the processing apparatus so that the method of Claim 1 is performed.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<History of the Present Disclosure>

In general, when a SiN film is formed by a thermal ALD method, a substrate to be processed is accommodated in a process container. A DCS gas is used as a Si raw material gas, and a $NH_3$ gas is used as a nitriding gas. The supply of the DCS gas and the supply of the $NH_3$ gas are repeated a predetermined number of times in a state in which the substrate is heated to a predetermined temperature, whereby a SiN film having a predetermined film thickness is formed on the surface of the substrate.

Specifically, by supplying the DCS gas, the DCS gas is caused to be adsorbed onto the surface of the substrate. Then, by supplying the $NH_3$ gas, the DCS gas and the $NH_3$ gas are caused to react with each other, thereby forming a SiN film having a monomolecular layer. By repeating the supply of the DCS gas and the supply of the $NH_3$ gas a predetermined number of times, a SiN film having a predetermined film thickness is formed.

Figure 1A:
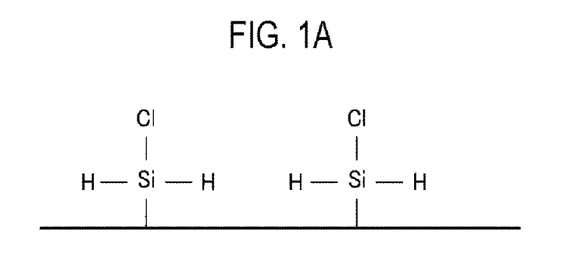
FIGS. 1A and 1B are views showing an adsorbed state of a DCS gas as a Si raw material and a nitrided state in a conventional thermal ALD method.

At this time, the DCS gas adsorbed onto the substrate is in a state shown in FIG. 1A. That is to say, Si in DCS has four bonds, one of which is bonded to the surface of the substrate. Cl is bonded to one of the remaining three bonds. H is bonded to the other two bonds.

Figure 1B:
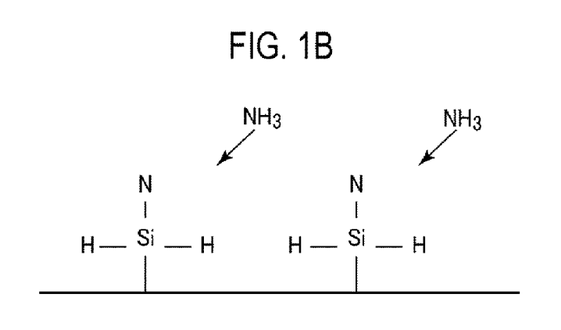

When the $NH_3$ gas is supplied in this state, Cl is easily replaced by N as shown in FIG. 1B. However, H is almost not replaced by N. Therefore, the number of sites contributing to a nitriding reaction is small, and the nitriding reaction hardly proceeds. Thus, the incubation time at an initial stage of film formation becomes longer.

In order to reduce the incubation time at the initial stage of film formation, there has been studied a method of improving the adsorptivity of a DCS gas by nitriding the surface of a substrate with a $NH_3$ gas or the like before the first flow of the DCS gas. However, in order to nitride and modify the surface of a substrate, it is necessary to use a condition of a temperature zone much higher than a film formation temperature or a condition of a high pressure zone. Otherwise, the effect is small. In an actual apparatus, the film formation temperature is substantially an upper limit temperature. Therefore, this method is not realistic.

As a result of extensive studies, it was found that it is effective to replace the bonding species of adsorbed Si other than Cl with Cl after causing a Si raw material to be adsorbed, and further that it is effective to supply a chlorine-containing compound after the adsorption of a Si raw material and before the supply of a nitriding gas. This finding has resulted in the present disclosure.

<Nitride Film Forming Method>

Next, a nitride film forming method according to an embodiment of the present disclosure will be described. In the present embodiment, a case where a silicon nitride film (SiN film) is formed as a nitride film will be described as an example.

Figure 2:
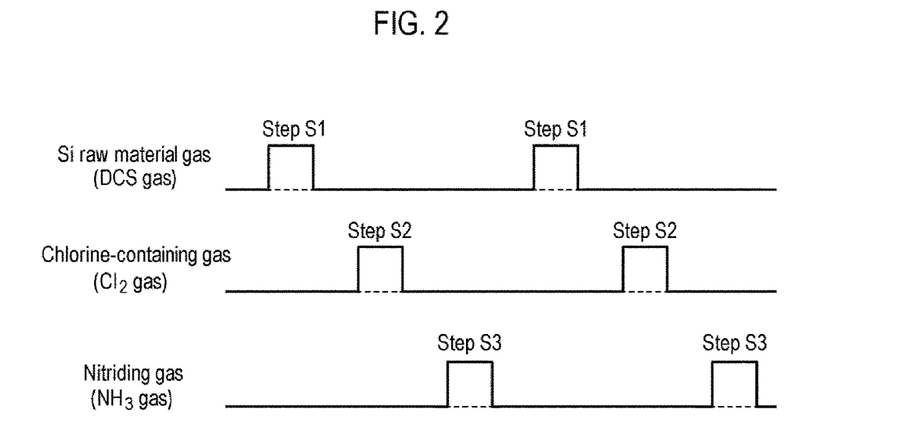
FIG. 2 is a view showing a gas sequence for explaining an example of a nitride film forming method according to the present embodiment.

FIG. 2 is a view showing a gas sequence for explaining an example of the nitride film forming method according to the present embodiment.

Figure 3:
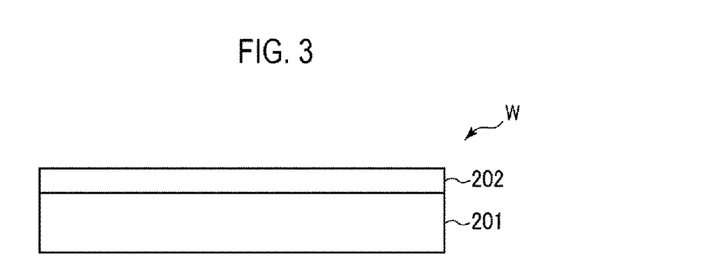
FIG. 3 is a view showing an example of a substrate to be processed when carrying out the nitride film forming method according to the present embodiment.

As a substrate to be processed, a semiconductor wafer (hereinafter simply referred to as a wafer) W having a predetermined base film 202 formed on a semiconductor substrate 201 as shown in FIG. 3 is prepared. Typically, a semiconductor silicon is used as the semiconductor substrate 201. As the base film 202, an oxide film ($SiO_2$ film), a nitride film (SiN film) or the like may be used. A substrate not having a base film 202 formed thereon may be used as the substrate to be processed.

Such a wafer W is set inside a process container of an appropriate processing apparatus. As shown in FIG. 2, the supply of a Si raw material gas, for example, a DCS gas (step S1), the supply of a chlorine-containing gas, for example, a $Cl_2$ gas (step S2) and the supply of a nitriding gas, for example a $NH_3$ gas (step S3) are sequentially performed with respect to the wafer W. These steps S1 to S3 are repeated a predetermined number of times. After each step, a process of removing an excess gas used in each step from the wafer W is performed. Such a process may be performed using an inert gas such as a $N_2$ gas or an Ar gas. The process of removing such a gas is appropriately set by a film forming apparatus to be described later.

Figure 4:
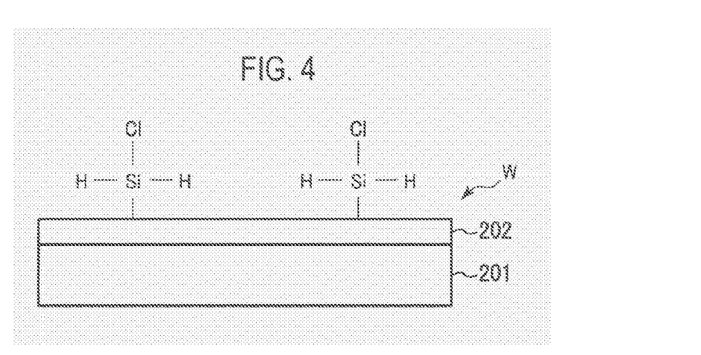
FIG. 4 is a view showing an adsorbed state of a DCS gas as a Si raw material in one example of the nitride film forming method according to the present embodiment.

In step S1, a Si raw material gas, for example a DCS gas is supplied. Thus, as shown in FIG. 4, the DCS gas as a Si raw material is adsorbed onto the surface of the base film 202.

Figure 5:
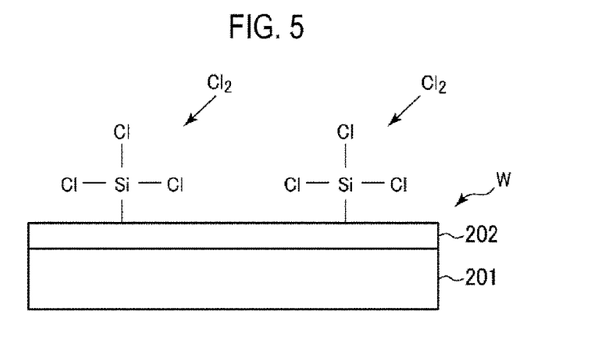
FIG. 5 is a view showing a supplied state of a chlorine-containing gas in one example of the nitride film forming method according to the present embodiment.

After step S1, the supply of the chlorine-containing gas, for example, the $Cl_2$ gas is performed in step S2. Thus, as shown in FIG. 5, bonding species other than Cl bonded to Si can be replaced by Cl and the adsorbed DCS gas can be modified into a gas having a larger amount of Cl bonded to Si.

Cl has good reactivity with the $NH_3$ gas. Therefore, as the supply of the nitriding gas, for example, the $NH_3$ gas is subsequently performed in step S3, the $NH_3$ gas shows good reactivity with the adsorbed substance which is modified so as to have a larger amount of Cl. Thus, the nitriding reaction is promoted and the incubation time can be shortened.

By performing the modification of the adsorbed DCS in this manner, the incubation time can be shortened regardless of the base film. Thus, the change in the incubation time due to the base film is suppressed. Even when an extremely thin film is formed in a region where different base films exist, it is possible to uniformly form the film.

Since the reactivity with the nitriding gas is improved in this way, it is possible to form a film at a lower film formation temperature than that of the conventional thermal ALD method and to expand the range of the film formation temperature. For example, in the prior art, the temperature range in which a film can be formed is 550 to 700 degrees C. and the practical temperature range is 600 to 650 degrees C. However, according to the present embodiment, it is possible to expand the temperature range, in which a film can be formed, to 400 to 700 degrees C. and to expand the practical temperature range to 500 to 650 degrees C. Since the film formation temperature can be lowered in this manner, such a film forming method is effective for a cold wall type film forming apparatus in which a substrate temperature cannot be raised so much.

Figure 6:
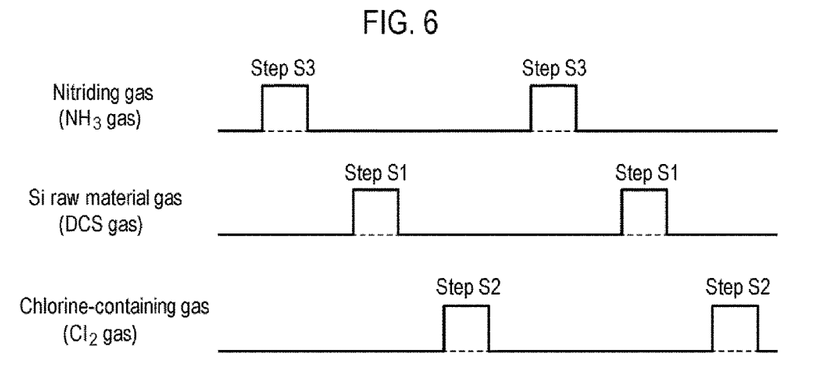
FIG. 6 is a view showing a gas sequence for explaining one example of the nitride film forming method according to the present embodiment.

In the gas supply sequence, as shown in FIG. 6, the supply of the nitriding gas in step S3 may be performed first. That is to say, the respective steps may be repeated in the order of step S3→step S1→step S2→step S3→ . . . . Even in this sequence, the adsorbed DCS gas is modified into a gas containing a large amount of Cl bonded to Si. Similarly, the nitriding reaction is promoted and the incubation time can be shortened.

As the Si raw material gas used in step S1, any material may be used as long as Cl is not bonded to at least one of the bonds of Si in the molecule thereof. In addition to DCS, it may be possible to use a chlorine-containing silane compound such as monochlorosilane (MCS; $SiClH_3$), trichlorosilane (TCS; $SiHCl_3$) or the like, a silane compound such as monosilane ($SiH_4$), disilane ($Si_2H_6$) or the like, and an organic silane-based compound such as aminosilane-based compound or the like.

As the chlorine-containing gas used in step S2, in addition to the $Cl_2$ gas, it may be possible to use an HCl gas, a $BCl_3$ gas or the like. From the viewpoint of reactivity, the $Cl_2$ gas is preferred.

As the nitriding gas used in step S3, in addition to the $NH_3$ gas, it may be possible to use a hydrazine ($N_2H_4$) gas or a derivative thereof, for example, a monomethyl hydrazine (MMH) gas.

As described above, the film formation temperature is 400 to 700 degrees C. and the practical temperature range is 500 to 650 degrees C., specifically 600 to 630 degrees C. In addition, a process pressure is set to a reduced pressure of 0.1 to 5 Torr (13.3 to 667 Pa).

<Experimental Example>

Next, descriptions will be made on an experimental example which compares an incubation time in the case where the SiN film is actually formed according to the above embodiment and an incubation time in the case where the SiN film is formed by the conventional thermal ALD method.

First, the relationship between the number of cycles and the film thickness of the SiN film was found for a case (case A) where film formation was performed on the surface of the wafer (surface of a Si substrate) by repeating the supply of gases in the order of DCS→$Cl_2$→$NH_3$→DCS . . . according to the sequence of the above embodiment shown in FIG. 2, a case (case B) where film formation was performed by repeating the supply of gases in the order of $NH_3$→DCS→$Cl_2$→$NH_3$ . . . according to the sequence shown in FIG. 6, a case (case C) where film formation was performed by repeating the supply of gases in the order of DCS→$NH_3$→DCS→$NH_3$ . . . according to the conventional thermal ALD method, and a case (case D) where film formation was performed by repeating the supply of gases in the order of $NH_3$→DCS→$NH_3$→DCS . . . according to the conventional thermal ALD method. The results are shown in FIG. 7.

Figure 7:
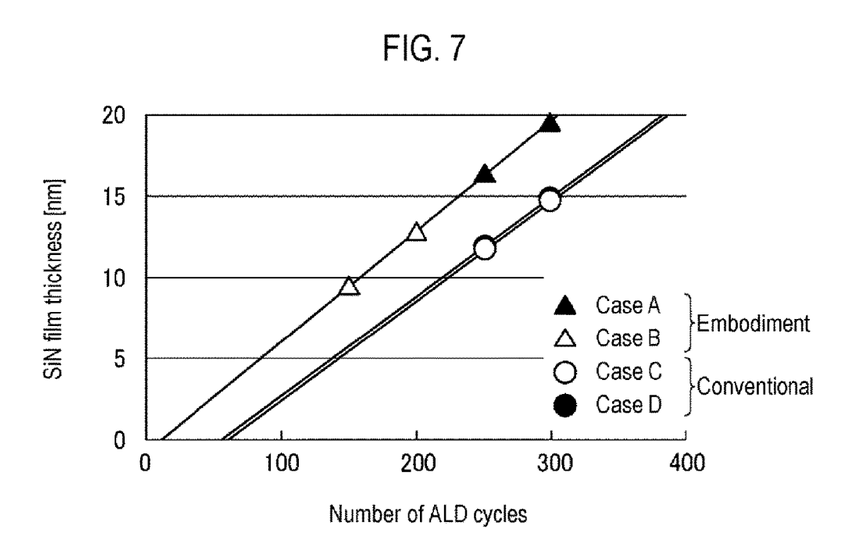
FIG. 7 is a view showing an incubation cycle (incubation time) when a SiN film is formed by a method according to the embodiment of the present disclosure and a conventional method.

As shown in FIG. 7, the incubation cycle (incubation time) was found by extrapolating the points plotting the relationship between the number of ALD cycles and the film thickness. As a result, in the case of the conventional thermal ALD method (case C and case D), SiN starts to grow when the number of cycles reaches about 62 (when the incubation cycle is about 62). In the case of the present embodiment (case A and case B), SiN starts to grow at about the 12th cycle (when the incubation cycle is about 12). As described above, it was confirmed that the incubation time can be greatly shortened by the present embodiment. Comparing the conventional cases C and D, the incubation time is slightly shorter in case D, in which the $NH_3$ gas is supplied first, than in case C. However, the extent of the shortening of the incubation time is not beyond the present embodiment.

Next, experiments were conducted to check dependence on the base film.

Figure 8:
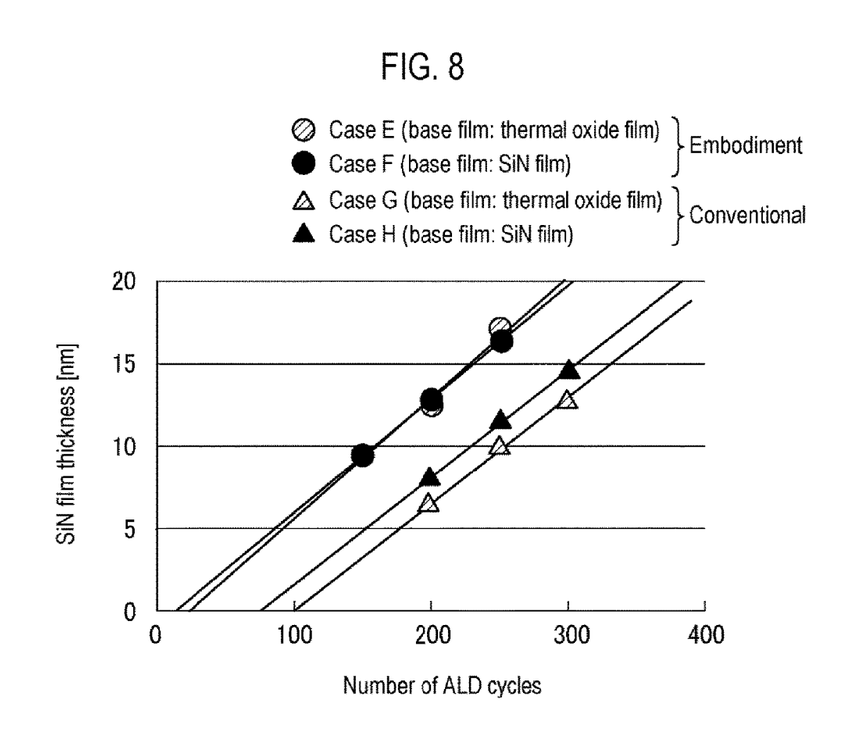
FIG. 8 is a graph showing the difference in an incubation cycle (incubation time) due to the difference in a base film when a SiN film is formed on a thermal oxide film and a SiN film as base films by a method according to the embodiment of the present disclosure and a conventional method.

The relationship between the number of cycles and the film thickness of the SiN film was found for a case (case E) where film formation was performed on a thermal oxide film ($SiO_2$ film) as a base film by repeating the supply of gases in the order of DCS→$Cl_2$→$NH_3$→DCS . . . according to the sequence of the above embodiment shown in FIG. 2, a case (case F) where film formation was performed on a SiN film as a base film according to the sequence of the above embodiment shown in FIG. 2 as in case E, a case (case G) where film formation was performed on a thermal oxide film ($SiO_2$ film) as a base film by repeating the supply of gases in the order of DCS→$NH_3$→DCS→$NH_3$ . . . according to the conventional thermal ALD method, and a case (case H) where film formation was performed on a SiN film as a base film according to the conventional thermal ALD method as in case G. The results are shown in FIG. 8.

It is conventionally known that when forming a SiN film by an ALD method, the incubation time is slightly longer on a thermal oxide film than on a SiN film. From the results of FIG. 8, it can be noted that according to the conventional thermal ALD method, in case G where the thermal oxide film is used as the base film, the incubation cycle is about 100 cycles and the incubation time is longer than that of case H where the SiN film is used as the base film. On the other hand, it was confirmed that in the case of the present embodiment, the incubation time is greatly shortened in both the case (case E) where the thermal oxide film used as the base film and the case (case F) where the SiN film is used as the base film. It was also confirmed that the variation of the incubation time depending on the base film is small.

<Film Forming Apparatus>

Next, an example of a film forming apparatus for carrying out the nitride film forming method according to the present disclosure will be described.

(First Example of Film Forming Apparatus)

In this example, a vertical batch-type film forming apparatus is shown as an example of the film forming apparatus.

Figure 9:
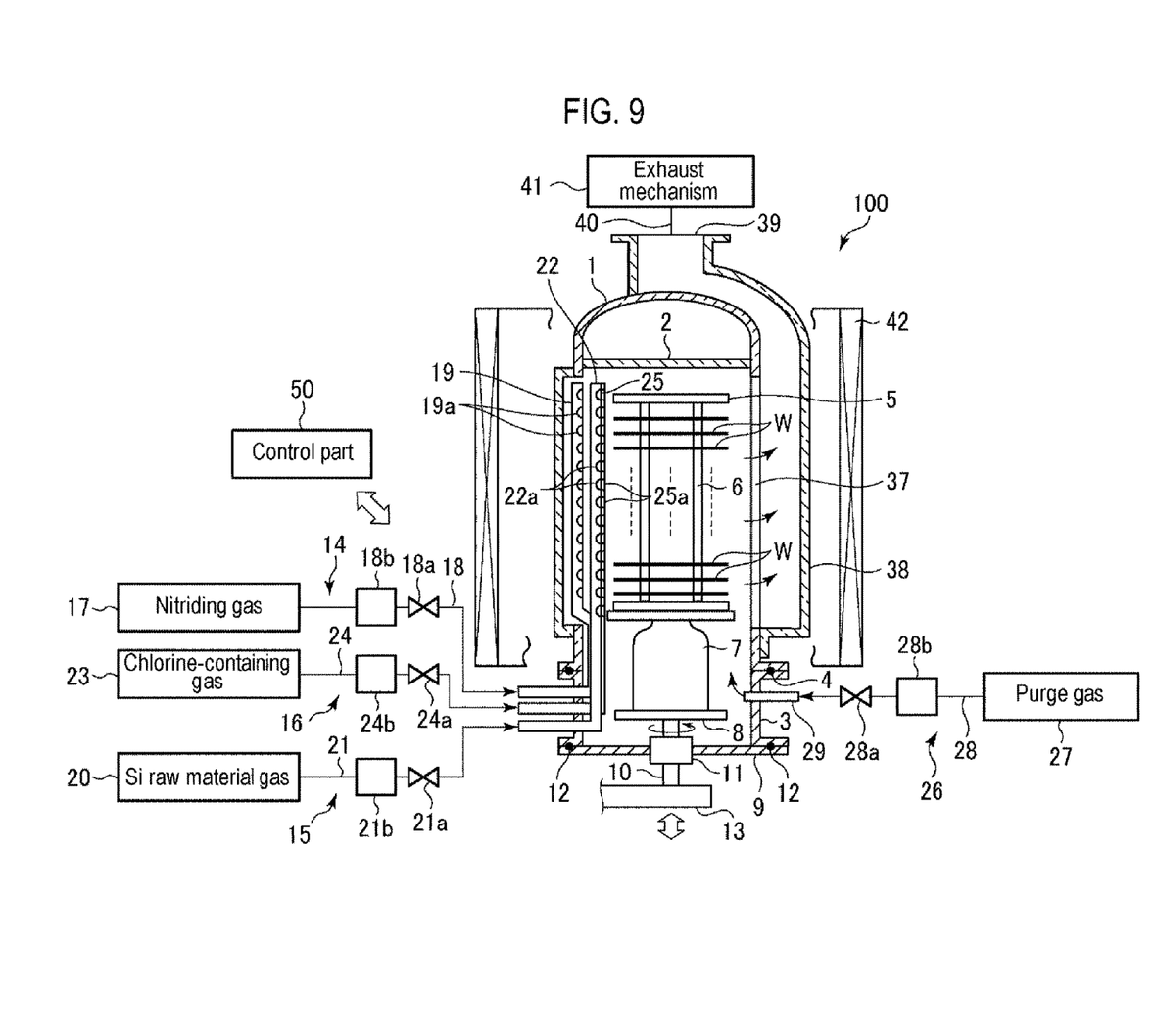
FIG. 9 is a vertical sectional view showing a first example of a film forming apparatus for carrying out the nitride film forming method of the present disclosure.
Figure 10:
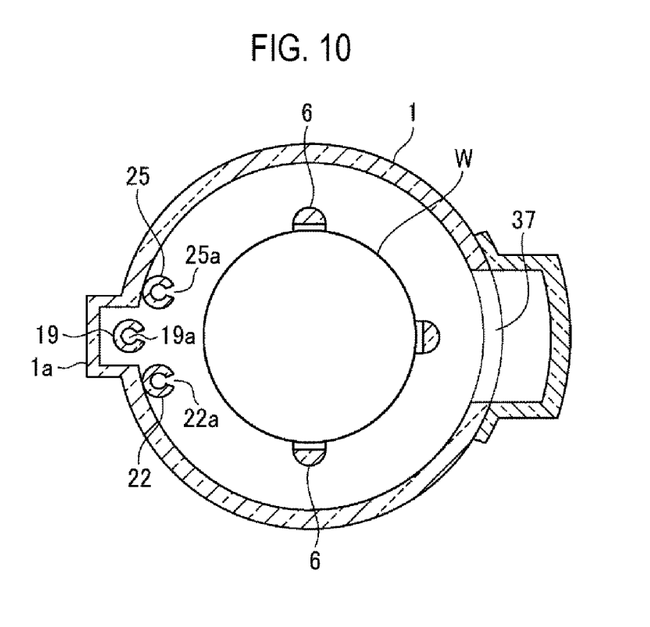
FIG. 10 is a horizontal sectional view of the film forming apparatus shown in FIG. 9.

FIG. 9 is a vertical sectional view showing a first example of the film forming apparatus for carrying out the nitride film forming method according to the present disclosure, and FIG. 10 is a horizontal sectional view showing the film forming apparatus of FIG. 9. In FIG. 10, a heating device is omitted.

The film forming apparatus 100 of this example includes a cylindrical process container 1 having a ceiling with its lower end opened. The entire process container 1 is made of, for example, quartz. The ceiling of the process container 1 is provided with and sealed by a ceiling plate 2 made of quartz. As will be described later, the process container 1 is configured to be heated by a heating device and is configured as a hot wall type film forming apparatus. A manifold 3 formed in a cylindrical shape by, for example, stainless steel is connected to a lower end opening portion of the process container 1 via a seal member 4 such as an O ring or the like.

The manifold 3 supports a lower end of the process container 1. A quartz-made wafer boat 5, on which a plurality of, for example, 50 to 150 semiconductor wafers (hereinafter simply referred to as "wafers") W as workpieces are placed in multiple stages, can be inserted into the process container 1 from below the manifold 3. The wafer boat 5 includes three support columns 6 (see FIG. 10). The plurality of wafers W is supported by grooves formed in the support columns 6.

The wafer boat 5 is placed on a table 8 via a quartz-made heat insulating tube 7. The table 8 is supported on a rotary shaft 10 that penetrates a lid 9 configured to open and close the lower end opening portion of the manifold 3 and made of, for example, stainless steel.

For example, a magnetic fluid seal 11 is installed in the penetration portion of the rotary shaft 10 to rotatably support the rotary shaft 10 while air-tightly sealing the penetration portion. A seal member 12 made of, for example, an O ring is installed between the peripheral portion of the lid 9 and the lower end portion of the manifold 3, thereby keeping the interior of the process container 1 in a sealed state.

The rotary shaft 10 is attached to the tip of an arm 13 supported by an elevating mechanism (not shown) such as, e.g., a boat elevator. The wafer boat 5, the lid 9 and the like are raised and lowered as a unit and are inserted into the process container 1. Alternatively, the table 8 may be fixedly provided on the lid 9 so that the wafers W can be processed without rotating the wafer boat 5.

The film forming apparatus 100 includes a nitriding gas supply mechanism 14 configured to supply a nitriding gas, for example, a $NH_3$ gas into the process container 1, a Si raw material gas supply mechanism 15 configured to supply a Si raw material gas, for example, a DCS gas, into the process container 1, a chlorine-containing gas supply mechanism 16 configured to supply a chlorine-containing gas, for example, a $Cl_2$ gas, into the process container 1. The film forming apparatus 100 further includes a purge gas supply mechanism 26 configured to supply an inert gas as a purge gas, for example, a $N_2$ gas, into the process container 1.

The nitriding gas supply mechanism 14 includes a nitriding gas supply source 17, a nitriding gas pipe 18 configured to guide the nitriding gas from the nitriding gas supply source 17, and a nitriding gas dispersion nozzle 19 connected to the nitriding gas pipe 18. The nitriding gas dispersion nozzle 19 is formed of a quartz tube which penetrates the sidewall of the manifold 3 toward the inside thereof, is bent upward and extends vertically. A plurality of gas discharge holes 19a is formed at a predetermined interval in the vertical portion of the nitriding gas dispersion nozzle 19 so that a nitriding gas can be substantially uniformly discharged from the respective gas discharge holes 19a into the process container 1 in a horizontal direction.

The Si raw material gas supply mechanism 15 includes a Si raw material gas supply source 20, a Si raw material gas pipe 21 configured to guide the Si raw material gas from the Si raw material gas supply source 20, and a Si raw material gas dispersion nozzle 22 connected to the Si raw material gas pipe 21. The Si raw material gas dispersion nozzle 22 is formed of a quartz tube which penetrates the sidewall of the manifold 3 toward the inside thereof, is bent upward and extends vertically. In the Si raw material gas dispersion nozzle 22, a plurality of gas discharge holes 22a is formed at a predetermined interval along the longitudinal direction thereof so that the Si raw material gas can be substantially uniformly discharged from the respective gas discharge holes 22a into the process container 1 in a horizontal direction.

The chlorine-containing gas supply mechanism 16 includes a chlorine-containing gas supply source 23, a chlorine-containing gas pipe 24 configured to guide the chlorine-containing gas from the chlorine-containing gas supply source 23, and a chlorine-containing gas dispersion nozzle 25 connected to the chlorine-containing gas pipe 24 and installed so as to penetrate the sidewall of the manifold 3. In the chlorine-containing gas dispersion nozzle 25, a plurality of gas discharge holes 25a is formed at a predetermined interval along the longitudinal direction thereof so that the chlorine-containing gas can be substantially uniformly discharged from the respective gas discharge holes 25a into the process container 1 in a horizontal direction.

The purge gas supply mechanism 26 includes a purge gas supply source 27, a purge gas pipe 28 configured to guide the purge gas from the purge gas supply source 27, and a purge gas nozzle 29 connected to the purge gas pipe 28 and installed so as to penetrate the sidewall of the manifold 3.

An opening/closing valve 18a and a flow rate controller 18b such as a mass flow controller or the like are installed in the nitriding gas pipe 18 so that the nitriding gas can be supplied while controlling the flow rate thereof. An opening/closing valve 21a and a flow rate controller 21b such as a mass flow controller or the like are installed in the Si raw material gas pipe 21 so that the Si raw material gas can be supplied while controlling the flow rate thereof. An opening/closing valve 24a and a flow rate controller 24b such as a mass flow controller or the like are installed in the chlorine-containing gas pipe 24 so that the chlorine-containing gas can be supplied while controlling the flow rate thereof. An opening/closing valve 28a and a flow rate controller 28b such as a mass flow controller or the like are installed in the purge gas pipe 28 so that the purge gas can be supplied while controlling the flow rate thereof.

A projecting portion 1a is formed on one side surface of the process container 1 so as to extend along a height direction. As shown in FIG. 10, the nitriding gas dispersion nozzle 19 is disposed in an internal space of the projecting portion 1a. The Si raw material gas dispersion nozzle 22 and the chlorine-containing gas dispersion nozzle 25 are installed so as to sandwich the nitriding gas dispersion nozzle 19.

In a portion of the process container 1a opposite to the projecting portion 1a, an exhaust port 37 for evacuating the interior of the process container 1 is formed in an elongated shape along the vertical direction of the side wall of the process container 1. An exhaust port cover member 38 formed in a U-like cross-sectional shape so as to cover the exhaust port 37 is attached to the portion of the process container 1 corresponding to the exhaust port 37. The exhaust port cover member 38 extends upward along the sidewall of the process container 1 and defines a gas outlet 39 above the process container 1. An exhaust pipe 40 is connected to the gas outlet 39. An exhaust mechanism 41 including a pressure regulation valve, a vacuum pump and the like is installed in the exhaust pipe 40. The interior of the process container 1 is exhausted by the exhaust mechanism 41, and the interior of the process container 1 is adjusted to a predetermined reduced pressure state.

A tubular heating device 42 for heating the process container 1 and the wafers W existing inside the process container 1 is installed outside of the process container 1 so as to surround the process container 1.

The film forming apparatus 100 includes a control part 50. The control part 50 includes: a main control part provided with a CPU and configured to control respective components of the film forming apparatus 100, for example, the valves, the mass flow controllers as flow rate controllers, the drive mechanisms such as an elevating mechanism and the like, the heater power supply, and the like; an input device such as a keyboard, a mouse or the like; an output device; a display device; and a memory device. By setting a storage medium storing a process recipe in the memory device, the main control part of the control part 50 causes the film forming apparatus 100 to execute a predetermined operation based on the process recipe called out from the storage medium.

Next, the operation when the SiN film is formed by the film forming apparatus 100 configured as above will be described. The following process operation is executed based on the process recipe stored in the storage medium of the memory part of the control part 50.

First, for example, 50 to 150 semiconductor wafers W, on which the predetermined base film described above is formed, are mounted in the wafer boat 5. The wafer boat 5 is placed on the table 8 via the heat insulating tube 7. By raising the arm 13 with the elevating mechanism, the wafer boat 5 is loaded into the process container 1 from the lower opening portion thereof.

Then, after the internal pressure of the process container 1 is adjusted to a pressure of 0.1 to 5 Torr (13.3 to 667 Pa), the opening/closing valve 28a is opened to supply a purge gas, for example, a $N_2$ gas, at a predetermined flow rate. In this state, the interior of the process container 1 is heated in advance by the heating device 42 so that the temperature of the central portion (the central portion in the vertical direction) of the wafer boat 5 becomes a temperature suitable for forming the SiN film, for example, a predetermined temperature which falls within a range of 400 to 700 degrees C.

Thereafter, while supplying the purge gas, the opening/closing valve 21a is opened to supply a Si raw material gas, for example, a DCS gas, into the process container 1, thereby allowing the DCS gas to be adsorbed onto the wafer W (step S1 in FIG. 2). After a lapse of a predetermined time, the opening/closing valve 21a is closed and the interior of the process container 1 is purged by the purge gas which is kept in a flowing state. After a lapse of a predetermined time, the opening/closing valve 24a is opened to supply a chlorine-containing gas, for example, a $Cl_2$ gas, into the process container 1, thereby performing a modification process (step S2 in FIG. 2). After a lapse of a predetermined time, the opening/closing valve 24a is closed and the interior of the process container 1 is purged by the purge gas which is kept in a flowing state. After a lapse of a predetermined time, the opening/closing valve 18a is opened to supply a nitriding gas, for example, a $NH_3$ gas, into the process container 1, thereby performing a nitriding process (step S3 in FIG. 2). After a lapse of a predetermined time, the opening/closing valve 18a is closed and the interior of the process container 1 is purged by the purge gas which is kept in a flowing state. These processes are repeated a predetermined number of times to form a SiN film having a predetermined film thickness.

The foregoing is directed to the film formation in the sequence shown in FIG. 2. However, a film may be formed according to the sequence shown in FIG. 6 by initially supplying the nitriding gas.

After completion of the formation of the SiN film, the interior of the process container 1 is purged by the purge gas while exhausting the interior of the process container 1 through the exhaust pipe 40 by the exhaust mechanism 41. Then, after returning the internal pressure of the process container 1 to atmospheric pressure, the arm 13 of the elevating mechanism is lowered to unload the wafer boat 5.

Examples of the gas supply conditions in the film forming apparatus 100 are as follows.
Flow rate of DCS gas: 500 to 2,000 sccm
Flow rate of $Cl_2$ gas: 50 to 5,000 sccm
Flow rate of $NH_3$ gas: 1,000 to 10,000 sccm
Flow rate of $N_2$ gas (purge gas): 50 to 5,000 sccm
DCS gas supply time per cycle: 3 to 60 sec
$Cl_2$ gas supply time per cycle: 1 to 60 sec
$NH_3$ gas supply time per cycle: 5 to 60 sec
Purge time per cycle: 1 to 30 sec (Second Example of Film Forming Apparatus)

In this example, a horizontal batch-type film forming apparatus is shown as an example of the film forming apparatus.

Figure 11:
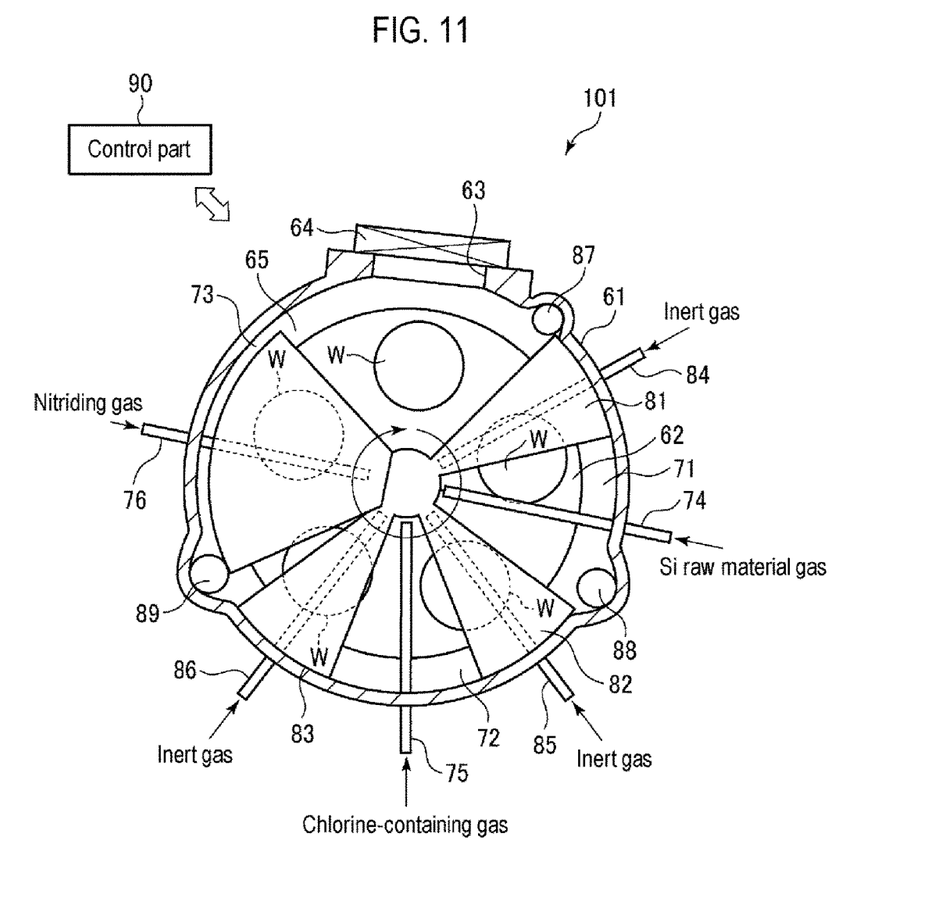
FIG. 11 is a sectional view showing a second example of the film forming apparatus for carrying out the nitride film forming method of the present disclosure.

FIG. 11 is a horizontal sectional view schematically showing a second example of the film forming apparatus for carrying out the nitride film forming method according to the present disclosure.

The film forming apparatus 101 of this example includes a metal-made process container 61 having a cylindrical shape and is configured as a cold wall type film forming apparatus. A turntable 62 on which a plurality of wafers W, for example, five wafers W, are mounted, is installed in the process container 61. The turntable 62 is rotated, for example, clockwise.

A loading/unloading gate 63 through which the wafer W is loaded into and unloaded from an adjacent transfer chamber (not shown) is formed in the peripheral wall of the process container 61. The loading/unloading gate 63 is opened and closed by a gate valve 64. A region corresponding to the loading/unloading gate 63 in the process container 61 is a loading/unloading region 65. In the loading/unloading region 65, the loading of the wafer W onto the turntable 62 and the unloading of the wafer W from the turntable 62 are performed.

The interior of the process container 61 except for the loading/unloading region 65 is divided into six areas along the rotation region of the turntable 62. That is to say, the interior of the process container 61 is divided into a first process area 71, a second process area 72 and a third process area 73, which are defined clockwise from the side of the loading/unloading region 65. The interior of the process container 61 is further divided into a first separation area 81 defined between the loading/unloading region 65 and the first process area 71, a second separation area 82 defined between the first process area 71 and the second process area 72, and a third separation area 83 defined between the second process area 72 and the third process area 73. As the turntable 62 rotates, the wafer W sequentially passes through these six areas. The first to third separation areas 81 to 83 have a function of separating gas atmospheres of the first to third process areas 71 to 73 from each other.

In the first process area 71, the second process area 72 and the third process area 73, a first process gas nozzle 74, a second process gas nozzle 75 and a third process gas nozzle 76 for discharging process gases toward the wafer W mounted on the turntable 62 are installed radially along the radial direction of the process container 61.

In the first separation area 81, the second separation area 82 and the third separation area 83, a first inert gas nozzle 84, a second inert gas nozzle 85 and a third inert gas nozzle 86 for discharging an inert gas, for example, a $N_2$ gas, toward the wafer W mounted on the turntable 62 are installed radially along the radial direction of the process container 61. The inert gas is discharged from these nozzles, whereby the process gas atmospheres are separated from each other.

Three exhaust ports 87, 88 and 89 are formed in the bottom of the process container 61. The interior of the process container 61 is exhausted through these exhaust ports 87, 88 and 89.

In the film forming apparatus 101, the Si raw material gas, for example, the DCS gas, is supplied from the first process gas nozzle 74. The chlorine-containing gas, for example, the Cl$_2$ gas, is supplied from the second process gas nozzle 75. The nitriding gas, for example, the NH$_3$ gas, is supplied from the third process gas nozzle 76. Accordingly, the first process area 71 is a Si raw material gas supply area, the second process area 72 is a chlorine-containing gas supply area, and the third process area 73 is a nitriding gas supply area.

The film forming apparatus 101 includes a control part 90. The control part 90 has the same configuration as the control part 50 of the film forming apparatus 100 of the first example.

In FIG. 11, details of the Si raw material gas supply mechanism, the chlorine-containing gas supply mechanism, the nitriding gas supply mechanism and the inert gas supply mechanism are omitted because they are configured similarly to those of the film forming apparatus 100. A heating device (not shown) is installed in the turntable 62. An exhaust pipe (not shown) is connected to the exhaust ports 87, 88 and 89. An exhaust mechanism (not shown) including a pressure regulation valve and a vacuum pump is installed in the exhaust pipe.

In such a film forming apparatus 101, the method of forming the SiN film of the above embodiment is realized under the control of the control part 90.

First, by opening the gate valve 64, a plurality of wafers W, for example, five wafers W, are sequentially loaded into the process container 61 by a transfer device (not shown) from an adjacent transfer chamber (not shown) via the loading/unloading gate 63 and are mounted on the turntable 62. Then, the internal pressure of the process container 61 is regulated to 0.1 to 5 Torr (13.3 to 667 Pa) by the exhaust mechanism. At this time, the turntable 62 is heated in advance so that the wafers W are heated to a predetermined temperature of 400 to 700 degrees C.

Next, in a state in which an inert gas, for example, a N$_2$ gas, is discharged from the first to third inert gas nozzles 84 to 86, the turntable 62 is rotated. The Si raw material gas, for example, the DCS gas, is discharged from the first process gas nozzle 74. The chlorine-containing gas, for example, the Cl$_2$ gas, is discharged from the second process gas nozzle 75. The nitriding gas, for example, the NH$_3$ gas, is discharged from the third process gas nozzle 76. The discharge of these process gases is started at a predetermined timing.

Thus, the wafer W sequentially passes through the first process area 71, the second separation area 82, the second process area 72, the third separation area 83, the third process area 73, and the first separation area 81. First, in the first process area 71, the DCS gas is adsorbed onto the wafer W (step S1 in FIG. 2). Then, in the second separation area 82, the excess DCS gas on the wafer W is removed by the N$_2$ gas. Then, in the second process area 72, a modification process is performed by the Cl$_2$ gas (step S2 in FIG. 2). Then, in the third separation area 83, the excess Cl$_2$ gas on the wafer W is removed by the N$_2$ gas. Then, in the third process area 73, a nitriding process is performed on the wafer W by the NH$_3$ gas (step S3 in FIG. 2). Then, in the first separation area 81, the excess NH$_3$ gas on the wafer W is removed by the N$_2$ gas. One cycle of ALD is performed by one turn of the turntable 62. By rotating the turntable 62 a predetermined number of times, a SiN film having a predetermined film thickness is formed.

The foregoing is directed to the film formation in the sequence shown in FIG. 2. However, the process gas discharge timing may be adjusted as in the sequence shown in FIG. 6, in which the nitriding gas is supplied at first.

After the formation of the SiN film is completed, while exhausting the interior of the process container 61 by the exhaust mechanism, the inert gas is supplied from the first to third inert gas nozzles 84 to 86 to purge the interior of the process container 61. Then, the internal pressure of the process container 61 is adjusted to a pressure of the transfer chamber. The gate valve 64 is opened and the wafers W are sequentially unloaded by the transfer device via the loading/unloading gate 63.

Examples of gas supply conditions in the film forming apparatus 101 are as follows.

Flow rate of DCS gas: 500 to 2,000 sccm
Flow rate of Cl$_2$ gas: 50 to 5,000 sccm
Flow rate of NH$_3$ gas: 1,000 to 10,000 sccm
Flow rate of N$_2$ gas (inert gas): 50 to 10,000 sccm (Third Example of Film Forming Apparatus)

In this example, a single wafer type film forming apparatus is shown as an example of the film forming apparatus.

Figure 12:
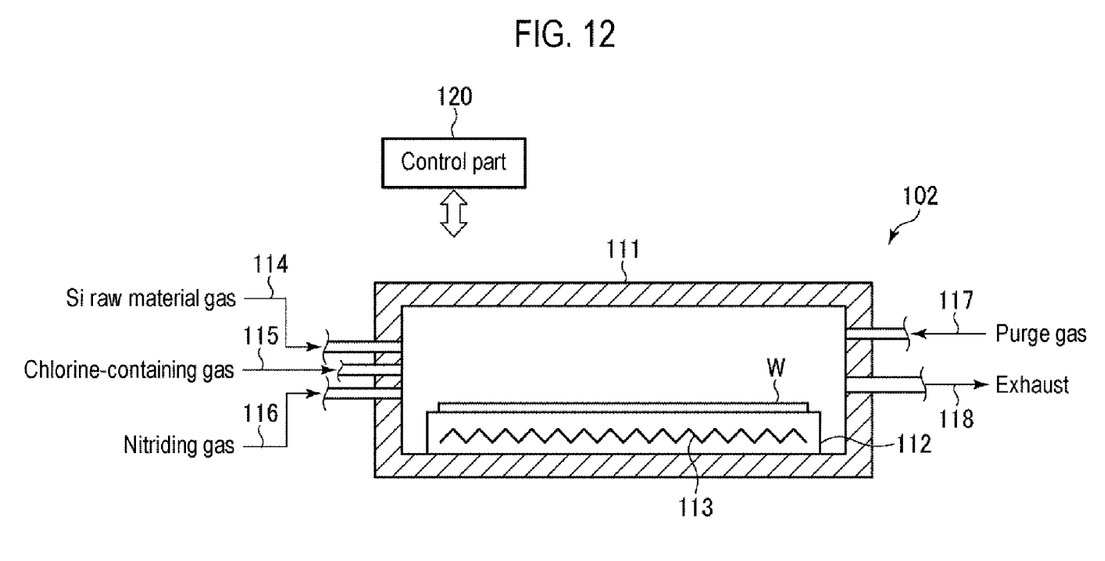
FIG. 12 is a sectional view showing a third example of the film forming apparatus for carrying out the nitride film forming method of the present disclosure.

FIG. 12 is a horizontal sectional view schematically showing a third example of the film forming apparatus for carrying out the nitride film forming method according to the present disclosure.

The film forming apparatus 102 of this example includes a metal-made process container 111 having a cylindrical shape and is configured as a cold wall type film forming apparatus. A substrate mounting table 112 is installed in the bottom of the process container 111. A wafer W as a substrate to be processed is mounted on the substrate mounting table 112. A heater 113 is installed inside the substrate mounting table 112.

A Si raw material gas pipe 114 configured to introduce a Si raw material gas, for example, a DCS gas, into the process container 111, a chlorine-containing gas pipe 115 configured to introduce a chlorine-containing gas, for example, a Cl$_2$ gas, into the process container 111, and a nitriding gas pipe 116 configured to introduce a nitriding gas, for example, a NH$_3$ gas, into the process container 111 are adjacently connected to a predetermined portion of the side surface of the process container 111.

A purge gas pipe 117 configured to supply an inert gas as a purge gas, for example, a N$_2$ gas, and an exhaust pipe 118 configured to exhaust the interior of the process container 111 are connected to the portion of the side surface of the process container 111 opposite to a portion to which the Si raw material gas pipe 114 and the like are connected.

The film forming apparatus 102 includes a control part 120. The control part 120 has the same configuration as the control part 50 of the film forming apparatus 100 of the first example.

In FIG. 12, details of the Si raw material gas supply mechanism, the chlorine-containing gas supply mechanism, the nitriding gas supply mechanism and the inert gas supply mechanism are omitted because they are configured similarly to those of the film forming apparatus 100. An exhaust mechanism (not shown) including a pressure regulation valve and a vacuum pump is installed in the exhaust pipe.

In such a film forming apparatus 102, the method of forming the SiN film of the above embodiment is realized under the control of the control part 120.

First, by opening a gate valve, a single wafer W is loaded by a transfer device (not shown) from an adjacent transfer chamber (not shown) via a loading/unloading gate and is mounted on the substrate mounting table 112. Then, the internal pressure of the process container 111 is regulated to 0.1 to 5 Torr (13.3 to 667 Pa) by the exhaust mechanism. At this time, the substrate mounting table 112 is heated in advance by the heater 113. Thus, the wafer W is heated to a predetermined temperature of 400 to 700 degrees C.

Thereafter, while supplying a purge gas, for example, a $N_2$ gas, a Si raw material gas, for example, a DCS gas, is supplied into the process container 111, thereby allowing the DCS gas to be adsorbed onto the wafer W (step S1 in FIG. 2). After a lapse of a predetermined time, the supply of the DCS gas is stopped and the interior of the process container 111 is purged by the purge gas which is kept in a flowing state. After a lapse of a predetermined time, a chlorine-containing gas, for example, a $Cl_2$ gas is supplied into the process container 111 to perform a modification process (step S2 in FIG. 2). After a lapse of a predetermined time, the supply of the $Cl_2$ gas is stopped and the interior of the process container 111 is purged by the purge gas which is kept in a flowing state. After a lapse of a predetermined time, a nitriding gas, for example, a $NH_3$ gas, is supplied into the process container 111 to perform a nitriding process (step S3 in FIG. 2). After a lapse of a predetermined time, the supply of the $NH_3$ gas is stopped and the interior of the process container 111 is purged by the purge gas which is kept in a flowing state. These processes are repeated a predetermined number of times to form a SiN film having a predetermined film thickness.

The foregoing is directed to the film formation in the sequence shown in FIG. 2. However, a film may be formed according to the sequence shown in FIG. 6 by supplying the nitriding gas at first.

After the formation of the SiN film is completed, the interior of the process container 111 is purged by the purge gas while exhausting the interior of the process container 111 through the exhaust pipe 118 by the exhaust mechanism. Then, the internal pressure of the process container 111 is adjusted to a pressure of the transfer chamber. The gate valve is opened and the wafer W is unloaded by the transfer device via the loading/unloading gate.

Examples of the gas supply conditions in the film forming apparatus 102 are as follows.

Flow rate of DCS gas: 10 to 2,000 sccm
Flow rate of $Cl_2$ gas: 10 to 5,000 sccm
Flow rate of $NH_3$ gas: 1,000 to 5,000 sccm
Flow rate of $N_2$ gas (purge gas): 50 to 5,000 sccm
DCS gas supply time per cycle: 0.1 to 60 sec
$Cl_2$ gas supply time per cycle: 0.1 to 60 sec
$NH_3$ gas supply time per cycle: 0.1 to 60 sec
Purge time per cycle: 0.1 to 60 sec <Other Applications>

While the embodiment of the present disclosure has been described above, the present disclosure is not limited to the above embodiment. Various modifications can be made without departing from the spirit of the present disclosure.

For example, in the above embodiment, there has been described the case where the silicon nitride film is formed using the Si raw material gas and the nitriding gas. However, the present disclosure is not limited thereto. The present disclosure may be applied to a case where other nitride films are formed using a raw material gas and a nitriding gas. For example, the present disclosure may be applied to formation of various nitride films, such as a case where a TiN film is formed using a Ti raw material, a case where a BN film is formed using a B raw material, a case where a WN film is formed using a W raw material, or the like.

While a vertical batch-type film forming apparatus, a horizontal batch-type film forming apparatus and a single wafer type film forming apparatus have been illustrated as typical examples of the film forming apparatus, the film forming apparatus is not limited to the illustrated ones. Other film forming apparatuses may be used as long as they can realize the nitride film forming method according to the present disclosure.

In the above embodiment, the semiconductor wafer is taken as an example of a substrate to be processed. However, the present disclosure is not limited thereto but may be applied to other substrates such as a glass substrate of a flat panel display, a ceramic substrate or the like. In addition, while there has been described the case where the oxide film ($SiO_2$) and the nitride film (SiN) are formed as base films on the surface of the substrate to be processed, the present disclosure is not limited thereto.

In the present disclosure, supplying a film forming raw material to a substrate to be processed is performed and subsequently, supplying a chlorine-containing gas to the substrate to be processed is performed. Thus, the adsorbed raw material gas is modified to promote a nitriding reaction. It is therefore possible to shorten an incubation time. In addition, when the nitride film is formed on different base films, the incubation time is hardly changed depending on the base films.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method for forming a nitride film on a substrate to be processed by a thermal ALD comprising repeating the following:
    adsorbing a first element to the substrate to be processed by supplying a film forming raw material gas including the first element and chlorine to the substrate to be processed while heating the substrate to be processed to a predetermined temperature; and
    nitriding the substrate to be processed by supplying a nitriding gas to the substrate to be processed,
    wherein the nitride film forming method further comprises replacing bonding species of the adsorbed first element other than chlorine with chlorine by supplying a chlorine-containing gas to the substrate to be processed after the adsorbing a first element to the substrate to be processed.

2. The method of claim 1, wherein the adsorbing a first element to the substrate to be processed is performed first.

3. The method of claim 1, wherein the nitriding the substrate to be processed is performed first.

4. The method of claim 1, wherein the chlorine-containing gas is at least one gas selected from a group consisting of a $Cl_2$ gas, an HCl gas and $BCl_3$ gas.

5. The method of claim 1, wherein the nitriding gas is an ammonia gas, a hydrazine gas or a hydrazine derivative gas.

6. The method of claim 1, wherein the substrate to be processed is provided on a surface thereof with a base film on which the nitride film is to be formed, and the base film is one or both of a $SiO_2$ film and a SiN film.

7. The method of claim 1, wherein the film forming raw material gas is a Si raw material gas, and a silicon nitride film is formed as a nitride film.

8. The method of claim 7, wherein the Si raw material gas as the film forming raw material gas has a molecule in which Cl is not bonded to at least one bonds of the Si raw material gas.

9. The method of claim 1, wherein the film forming raw material gas is any one of dichlorosilane, monochlorosilane, trichlorosilane, monosilane, disilane and an organic silane-based compound.

10. The method of claim 7, wherein a heating temperature of the substrate to be processed is 400 to 700 degrees C.

11. A non-transitory computer-readable storage medium storing a program operated on a computer and configured to control a processing apparatus,
wherein the program is configured to, when executed, cause the computer to control the processing apparatus so that the method of claim 1 is performed.

* * * * *